(12) United States Patent
Ueno et al.

(10) Patent No.: US 7,151,384 B2
(45) Date of Patent: Dec. 19, 2006

(54) PROBE DEVICE AND DISPLAY SUBSTRATE TESTING APPARATUS USING SAME

(75) Inventors: Toshiaki Ueno, Kanagawa (JP); Norihide Yamada, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/540,646

(22) PCT Filed: Jan. 23, 2004

(86) PCT No.: PCT/JP2004/000631

§ 371 (c)(1),
(2), (4) Date: Jun. 24, 2005

(87) PCT Pub. No.: WO2004/068155

PCT Pub. Date: Aug. 12, 2004

(65) Prior Publication Data

US 2006/0087327 A1 Apr. 27, 2006

(30) Foreign Application Priority Data

Jan. 27, 2003 (JP) .............................. 2003-018042

(51) Int. Cl.
 *G01R 27/08* (2006.01)
 *G01R 31/00* (2006.01)
(52) U.S. Cl. ..................................... 324/713; 324/770

(58) Field of Classification Search ................ 324/713, 324/770
See application file for complete search history.

(56) References Cited

U.S. PATENT DOCUMENTS

| 4,967,149 | A | * | 10/1990 | Doemens et al. ............ 324/514 |
| 5,202,623 | A | * | 4/1993 | LePage ....................... 324/758 |
| 5,908,565 | A | * | 6/1999 | Morita et al. .......... 219/121.43 |
| 6,268,719 | B1 | * | 7/2001 | Swart ......................... 324/752 |
| 6,729,922 | B1 | * | 5/2004 | Hiroki ........................ 324/750 |

FOREIGN PATENT DOCUMENTS

| JP | 2-002969 | 1/1990 |
| JP | 11-174106 | 7/1999 |
| JP | 2001-093871 | 4/2001 |
| JP | 2001-272431 | 10/2001 |
| WO | WO 00/24048 | 4/2000 |

* cited by examiner

*Primary Examiner*—Andrew H. Hirshfeld
*Assistant Examiner*—Timothy J. Dole

(57) ABSTRACT

A plasma having a certain density is generated between a test electrode and an electrode on a display substrate comprising a TFT array which is a circuit under test, and a test signal is transmitted between the electrode and the test electrode via the plasma. With this technique, a probe means and a testing apparatus enabling measurement of the electrical characteristics of the TFT array formed on the display substrate in a non-contact manner can be provided.

11 Claims, 13 Drawing Sheets

PROBE DEVICE AND DISPLAY SUBSTRATE TESTING APPARATUS USING SAME

FIELD OF THE INVENTION

The present invention relates to testing the electrical characteristics in the manufacturing stage of a liquid crystal display or an organic electroluminescent material (EL) display panel, and more particularly to a probe device suited to the electrical testing of a thin-film transistor (hereinafter, referred to as TFT) array and a display substrate testing apparatus using the same.

DISCUSSION OF THE BACKGROUND ART

A large number of pixels and a larger screen are sought for liquid crystal displays. In the past few years, the active matrix system using thin-film transistors (TFTs) has become dominant in order to achieve the demanded high image quality. In contrast to a liquid crystal display that requires a backlight, a self-emitting organic EL (also referred to as an organic light-emitting diode (OLED)) has advantages not present in liquid crystal displays and has been developed at a rapid pace over the past few years.

In the manufacture of TFT liquid crystal displays or organic EL displays, the so-called TFT array test is performed to electrically test whether or not the finished TFT array operates electrically in the stage where the TFT array was formed on the glass substrate, that is, before sealing the liquid crystal or the organic EL coating process. Testing is extremely important in improving the final yield of finished products in display manufacturing. In the TFT array test stage, if electrical defects were discovered in the TFT circuit driving specific pixels, the defect is repaired when the defect can be repaired, based on the TFT array test information. In addition, later processes can be stopped when there are many defects and a decision of defective product can be made in advance in the shipping inspection after assembly of the display. The advantage of some actions for this type of defective product is the omission of subsequent expensive processes such as bonding the color filters and sealing the liquid crystal for liquid crystal displays or performing the organic EL coating process for organic EL displays.

A TFT array usually forms a drive circuit for each pixel using a plurality of TFTs on a glass substrate of only the number corresponding to the number of pixels in the display. In the past few years, TFT arrays have generally been formed by using amorphous silicon or low-temperature polysilicon. FIG. 13 shows an example of a typical TFT drive circuit for one pixel in the popular liquid crystal display. In the figure, reference 250 denotes a data line; 251, a gate line; 252, a common line; 253, a liquid crystal; and 254, a transparent electrode using indium tin oxide (ITO). Usually, the structure formed on a glass substrate wherein the number of drive circuits, shown in FIG. 13, is only the number of pixels in a two-dimensional configuration is called a TFT array. Since an actual TFT array test for the liquid crystal is normally performed before sealing the liquid crystal 253, the drive circuit is electrically tested in the state without liquid crystal 253 in FIG. 13.

The number of exposed ITO electrodes 254 equal to only the number of pixels is arranged in a two-dimensional array on the surface of the glass substrate in the stage wherein the TFT array was formed. The testing method for this type of drive circuit usually electrically switches the TFTs and measures the potential to determine whether a normal potential is generated on the surface of the ITO electrode 254. In the state wherein a voltage was applied to the data line 250, the selected TFT transistor can be set in the ON state by applying a voltage to the gate line 251 of the drive circuit to be tested. At this time, the TFT transistor can be judged to be normal if the same voltage as the voltage applied to the data line is generated in the ITO electrode 254.

The proposed methods for measuring the electrical potential of the surface of the ITO are (1) a method that reads the charge stored temporarily in an electrostatic capacitor Cs in reverse through the data line, (2) a method that irradiates an electron beam on the ITO surface and measures the potential from the quantity of secondary electrons generated corresponding to the surface potential, and (3) a method that indirectly measures the potential as light information by using a nonlinear electro-optical effect such as the Pockels effect.

Conventionally, the quality of a drive circuit could be decided by measuring the surface potential of the ITO similar to the example of the drive circuit for liquid crystal shown in FIG. 13. On the other hand, since an organic EL display is a self-emitting display not requiring a backlight, the brightness of each pixel should be controllable, and the ability to control the drive current of each pixel is required. Therefore, a TFT array tester must measure the current drive capacity of the drive circuit from the electrode surface composed of ITO, for example, before coating the organic EL. Consequently, a TFT array tester for liquid crystal with the object of evaluating the characteristics of a constant voltage drive circuit in conventional use cannot be applied to the evaluation of organic EL displays.

To solve the above-mentioned problem, an inspection method using an additional conductive film for inspection (refer to Japanese Kokai Unexamined Patent Publication No. 2002-108,243) and an inspection method that introduces an electrolytic fluid between the pixel electrode of the TFT array and the opposing detection electrode (refer to Japanese Kokai Unexamined Patent Publication No. 2002-72198) were proposed. However, according to the former, the causes of defect generation increase because a conductive film for inspection is formed, this film must be removed after inspection, and additional processes are required. Therefore, the former method is not necessarily appropriate when the manufacturing yield is considered. According to the latter method, a substrate including the TFT array contributes to the causes of defect generation because parts that should not be submerged in electrolytic fluid are also included. Consequently, avoiding this kind of wet process is preferred. Furthermore, another method to consider is a method wherein an electromagnetic signal source is disposed on the back surface of the inspection electrode, and the air between a transparent inspection electrode and a pixel electrode is ionized by this electromagnetic signal so that an electromagnetic signal such as X-rays generated by the above-mentioned electromagnetic signal source passes through the inspection electrode, and current flows between the inspection electrode and the pixel electrode (refer to Japanese Kokai Unexamined Patent Publication No. 2002-123,190). However, in this structure, sufficient current density cannot be obtained when inspecting the TFT element operation even when the electrical conduction of the circuit can be inspected.

Therefore, an object of the present invention is to provide probe means capable of measuring the current drive capability of a current-driven TFT array such as for organic EL, in particular, before the organic EL coating process without physical contact with the ITO surface in a testing apparatus for testing the electrical characteristics of a TFT array formed on a display substrate. In addition, another object of the present invention is to provide a display substrate testing apparatus using the probe means.

SUMMARY OF THE INVENTION

The probe apparatus of the present invention comprises a glass display substrate forming a TFT array, which is the circuit under test; a current injection electrode for injecting a test signal in plasma that is disposed at a distance from the glass display substrate; a plasma generation means for filling plasma in the space between an ITO electrode connected to the circuit under test and the current injection electrode; a power supply for array testing that applies a voltage between the current injection electrode and the TFT array and makes current flow in plasma; and a TFT array controller for generating signals to electrically control the sequential turning on and off of the TFT array.

The plasma is in a state where substances have been ionized into negative and positive ions by the energy supplied by a high-frequency signal or discharging. In addition, the plasma is electrically neutral and is conductive because the motion of the ions is produced by applying an electric field. Therefore, the plasma can be used as a conducting medium, and current can flow through the plasma by ion conduction when an electric field is applied between the ITO filled with plasma and the current injection electrode.

By using plasma as a conducting medium in this way, means capable of testing the current drive capability of the TFT array without physical contact with the ITO surface can be provided. The surface of the ITO electrode is exposed to the plasma. The current injection electrode for producing the current for testing flow in the plasma is similarly exposed to the plasma on the other side of the plasma. The plasma generation means for generating the plasma that becomes the conducting medium has a plasma density for obtaining the conductivity in the plasma needed for testing. To inspect a TFT element, for example, a current of approximately 1 μA to 10 μA, or preferably, several μAs to about 10 μA is demanded. When the electrons in the plasma are the primary carriers of the conductivity, a plasma having a high electron temperature is required. In relation to the embodiments described later, the current injection electrode in the figures is illustrated as a needle shape, but is not restricted to this shape. For example, there is no change in the effect obtained even when a parallel plate is used.

The data line and the gate line are controlled from the outside by a TFT array controller at the ITO electrode connected to the drain of the TFT under test, and the TFT is set in the ON state. At this time, when a voltage is applied between the drive line connected to a common source of the TFTs and the current injection electrode, a current Ip flows between the current injection electrode and the ITO electrode through the plasma. The current drive capability of the TFT can be found by measuring the current flowing in this plasma. Similarly, in the state wherein the drive circuits in contact with the plasma are sequentially turned on, if the current flowing in the plasma is measured, the electrical characteristics of the entire TFT array on the display can be tested. If the current Ip flowing in the plasma current is set to the maximum drive current of the organic EL, the current drive capability of all of the TFTs onto the panel can be tested in advance before the organic EL is actually coated onto the ITO electrode surface.

When the desired current does not flow in the TFT even when set to the maximum drive current of the drive circuit, the TFT is defective. When current does not flow in the plasma although the TFT under test is set to ON, a short circuit defect or a broken wire in the wiring of the TFT under test is suspected. When the plasma current and the current flowing in the TFT do not match, a gate leak in the TFT or a current leak in the drive line is suspected. Consequently, defect diagnosis of a TFT array is possible, and decision criteria can be provided when the repair of defects is usually performed before the organic EL coating process. Therefore, the final yield of defective assembled products can be greatly improved in the fabrication of organic EL display panels.

By using the probe device and the display substrate testing apparatus using this probe of the present invention, testing means that does not damage the ITO surface compared to a physical contact probe using, for example, a needle can be provided. Furthermore, by simultaneously irradiating a plurality of TFT arrays with plasma, high-speed testing is possible by only electrically switching the TFT array externally by a TFT array controller. In addition, all of the TFT array tests can be performed in a short time period because the mechanical positioning of the probe, which was essential when using a probe having a physical contact with the ITO electrode, becomes unnecessary. Today, high-density plasma generation means are widely used in growing thin-films and etching in silicon LSI processes. By selecting the plasma generation conditions and the type of gas, a plasma that does not chemically react with the ITO electrode can be generated. However, in order to not damage the ITO surface, preferably, a glow discharge plasma is used.

The present invention provides a probe device constructed to generate relatively high-density plasma between the electrode or wire connected to the circuit under test and the test electrode, transmits the test signal through the plasma between the electrode or wire and the test electrode, and enables testing of the circuit under test without contact with the electrode or wire.

Preferably, the circuit under test is an electronic circuit comprising a plurality of thin-film transistors formed on a substrate.

Preferably, the substrate is a display substrate. The circuit under test and the electrode or wire form the drive circuit for driving one pixel of the display. The drive circuits form a two-dimensional array on the substrate.

Preferably, the electrical characteristics of the designated drive circuit are tested by continuously generating the plasma extending over a plurality of units of the drive circuits and applying the test signals to designated drive circuits when only the drive circuits designated to be tested are set in the ON state.

Preferably, the excess level of the test signal transmitted through the plasma is controlled by providing a control electrode between the test electrode and the electrode or wire and controlling the potential applied to the control electrode.

Preferably, the structure comprises two bias power supplies, each connected independently to either the test electrode or the circuit under test, and the electric fields near the interfaces between the plasma and either the test electrode or the electrode or wire can be controlled.

Preferably, the plasma is separated and generated above the substrate corresponding to the position of each unit of the drive circuit and a test electrode is disposed at every separated position. Then the electrical characteristics of the drive circuit are tested by applying the test signal to the drive circuit at each position.

Preferably, a plasma generation source for generating the plasma and a chamber structure that encloses the plasma and releases the plasma on at least the electrode or wire of the drive circuit are provided.

Preferably, either means for exhausting the plasma or air curtain means is disposed at a position along the periphery of the chamber structure.

Preferably, the plasma has a plasma density capable of producing a current flowing in the circuit under test at about 1 μA to 10 μA.

Preferably, the plasma is chemically inert relative to the electrodes or the wires.

Preferably, the plasma has at least a composition that ionizes oxygen.

Furthermore, the present invention provides a display substrate testing apparatus comprising the abovementioned probe device, a signal generation source for generating the test signal provided to the test electrode; and a signal comparator for comparing the test signal to the output signal output from the drive circuit when the test signal is applied through the plasma and the electrode or wire to each of the drive circuits on the substrate.

Preferably, the display substrate testing apparatus provides X-Y motion means for moving the probe device in the directions of two horizontal dimensions along the electronic circuit under test or the display substrate surface.

As is understood from the above structure or the embodiments to be described, the present invention has the following advantages.

(1) A probe means that does not physically damage the ITO electrode surface can be provided because the electrical characteristics of the TFT array can be tested by using plasma as the conducting medium and has no physical contact with the surface of the TFT array under test.

(2) The test information required for defect repair of the TFT array can be obtained because the defect locations and the defect modes of the TFT array can be specified from the current conducted by the plasma.

(3) Electrical defects can be detected before assembling the TFT array panel because means for testing the current drive characteristics can be provided before the organic EL coating process in the characteristics testing of the TFT array for organic EL requiring a current drive. Therefore, the defect yield in the manufacturing process can be substantially improved.

(4) A plurality of TFT array panels formed on a large glass substrate can be tested in a short time period by providing a plurality of probe heads and simultaneous parallel operation.

PREFERRED EMBODIMENTS ACCORDING TO THE INVENTION

With reference to the attached drawings, the probe device and the display substrate testing apparatus using the same that become the preferred embodiments of the present invention are described in detail.

Figure 1:
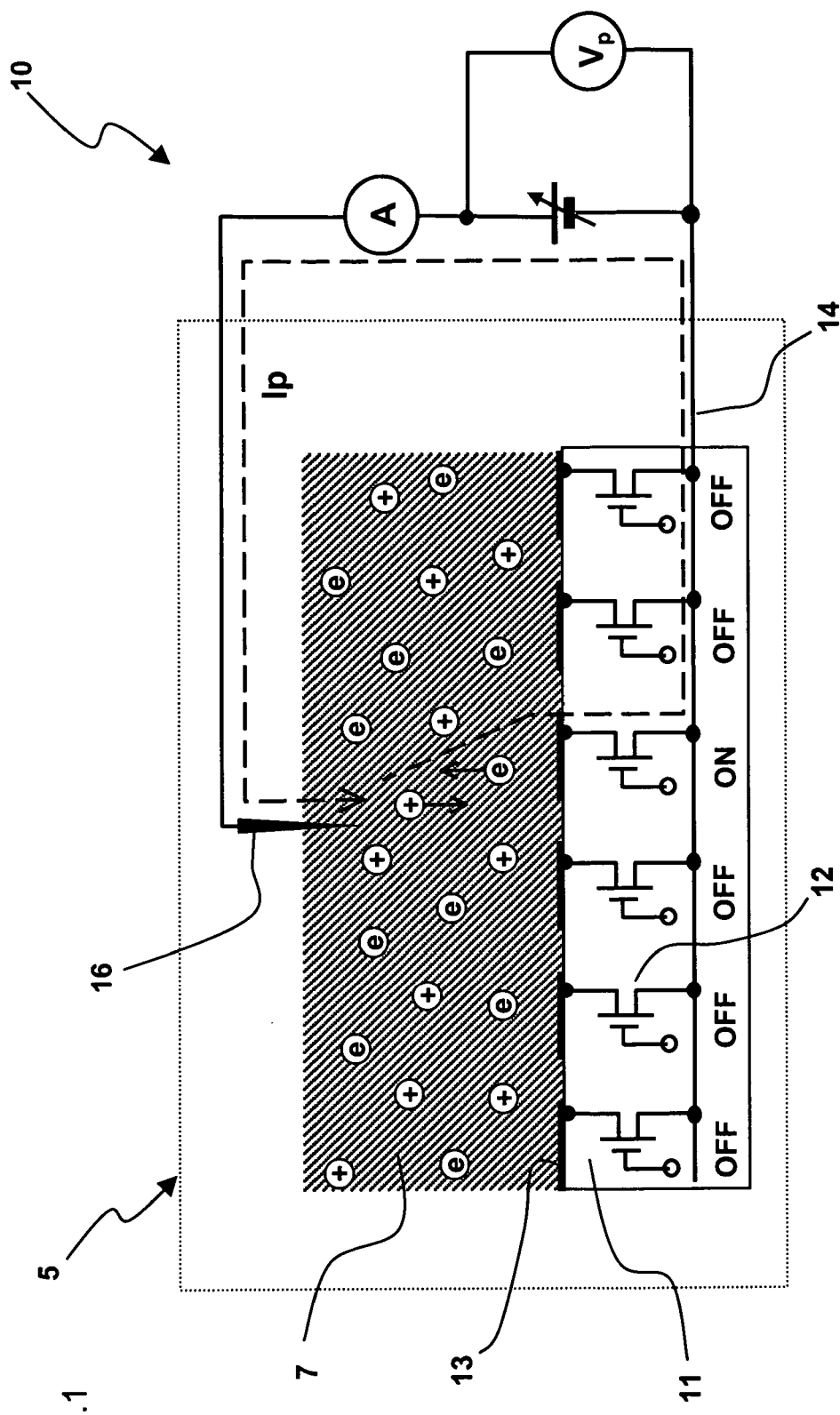
FIG. 1 is a schematic drawing showing a first embodiment of the present invention.

FIG. 1 is a schematic diagram showing a first embodiment of the present invention and shows the basic structure of the display substrate testing apparatus 10 using the probe device 5 according to the present invention. In the figure, reference 7 denotes a plasma; 11, a glass display substrate (hereinafter, simply referred to as the display substrate); 12, a TFT; 13, an ITO electrode; 14, a drive wire; and 16, a current injection electrode. As illustrated in the figure, transparent indium tin oxide (ITO) electrodes 13 are formed on the surface of the display substrate 11. The display substrate 11 has drive circuits corresponding to the pixels. An ITO electrode 13 described above is provided for each drive circuit. The drive circuits are arranged in a two-dimensional array on the display substrate 11 and construct the pixels. The ITO electrode 13 and the TFT 12 connected thereto are also arranged in a two-dimensional array. This structure is referred to as a TFT array. In FIG. 1, only a portion of a typical TFT array is shown. Usually, at least two TFTs are included in the drive circuit forming one pixel. For convenience of explanation, only the TFT 12 in the final stage is shown in FIG. 1.

The display substrate testing apparatus 10 according to this embodiment provides means for applying current to the drive circuits without contact with the ITO electrodes 13 of the display substrate 11 and should test the operation of the TFT of each drive circuit in the display substrate 11. In the present invention, plasma 7 having electrical conductivity is formed between the current injection electrode 16 and the ITO electrode 13. In FIG. 1, the plasma generation means is not shown, but to generate plasma, at least appropriate pressure reduction means, gas injection means, and electrode means are disposed near the display substrate 11.

When plasma 7 is generated, the surfaces of the ITO electrodes 13 on the display substrate 11 are in contact with the plasma 7. The current injection electrode 16 at the position opposite the display substrate 11 is in contact with the plasma 7. In this state, when the specified TFT 12 is set in the ON state and the voltage Vp is applied between the current injection electrode 16 and the drive line 14, the current Ip flows in the plasma. By measuring this current, the operation of the TFT 12 in the drive circuit can be verified. Consequently, the electrical characteristics of the entire TFT array can be found by measuring each current Ip when the TFT array is successively set in the ON state.

Figure 2:
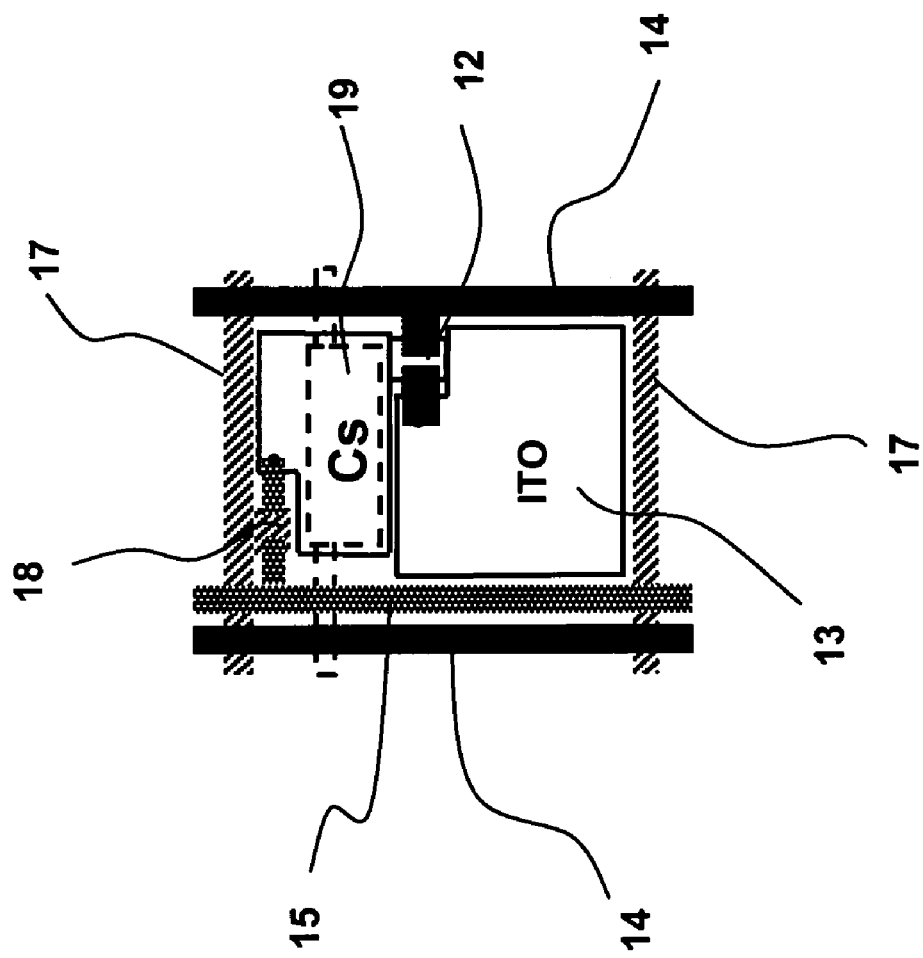
FIG. 2 is a diagram illustrating the layout of a drive circuit using a TFT.

In particular, FIG. 2 is a schematic top view showing the drive circuit corresponding to one pixel of the TFT array on the display substrate used in an organic EL display. The circuit for one pixel that is shown is arranged in a two-dimensional array on the surface of the display substrate 11 (see FIG. 1). Reference number 12 in the figure denotes a TFT; 13, an ITO electrode; 14, a drive line; 15, a data line; 17, a gate line; 18, a TFT; and 19, an electrostatic capacitor Cs. Since the surfaces of the gate line, drive line, and TFTs excluding the ITO electrode 13 are covered by an insulating film, electrical short circuits and poor operation caused by the conductivity of the plasma do not occur even if the insulation is exposed to the plasma during testing.

Figure 3:
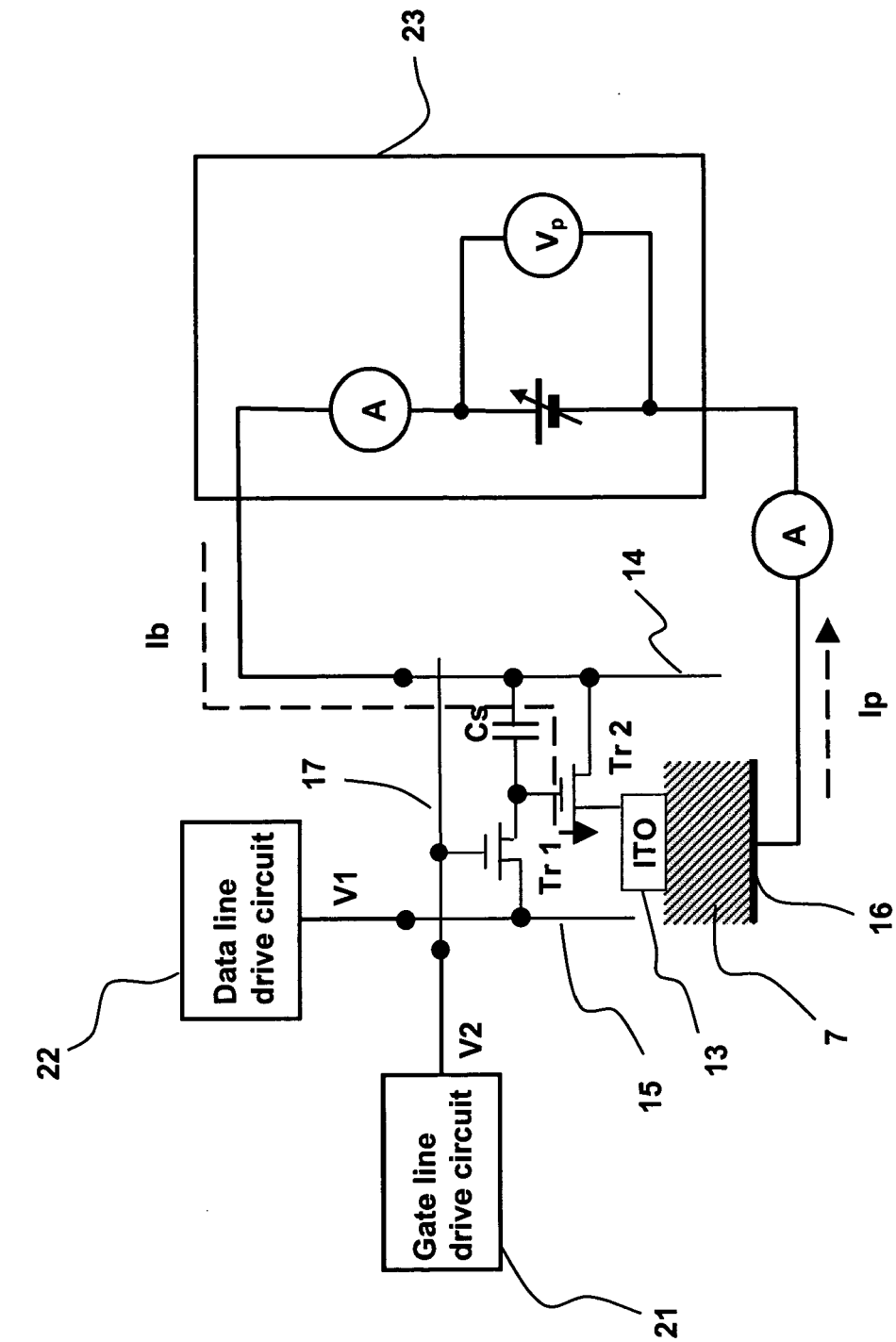
FIG. 3 illustrates an example of testing the drive circuit for one pixel shown in FIG. 2 that uses the probe device shown in FIG. 1.

FIG. 3 shows an example of testing means using the probe device shown in FIG. 1 to test the drive circuit of one pixel shown in FIG. 2. In the figure, a gate line drive circuit 21, a data line drive circuit 22, and a test power supply 23 are newly added. The gate line drive circuit 21, the data line drive circuit 22, and the test power supply 23 are provided in the testing apparatus 10 using the probe device 5. In the state with voltage V1 applied from the data line drive circuit 22 to the data line 5, TFT transistor Tr1 under test is turned on by applying voltage V2 from the gate line drive circuit 21 through the gate line 17. This can set transistor Tr2 in the ON state. At this time, if voltage Vp is applied to drive line 14 by the test power supply 23, a closed circuit is formed by the plasma 7, ITO electrode 13, and current injection electrode 16.

When Tr2 is operating normally, the current Ip flowing through the plasma matches the current Ib flowing in Tr2 via the drive line 14. If Ip does not match Ib temporarily, defects such as a gate leak in Tr2, and leaks of the ITO and various control lines are considered. When Ip does not flow at all, a short-circuit defect of Tr2 is considered. In a normal organic EL display, since the drive circuit needed to operate each organic EL is about several micro-amperes to 10 micro-amperes, Ib flowing through Tr2 can be verified by the normal flows of interacting currents. The electrical characteristics of the entire TFT array on the display panel can be tested by performing the measurements following a procedure similar to the abovementioned and successively switching the data line 15 and the gate line 17.

Figure 4:
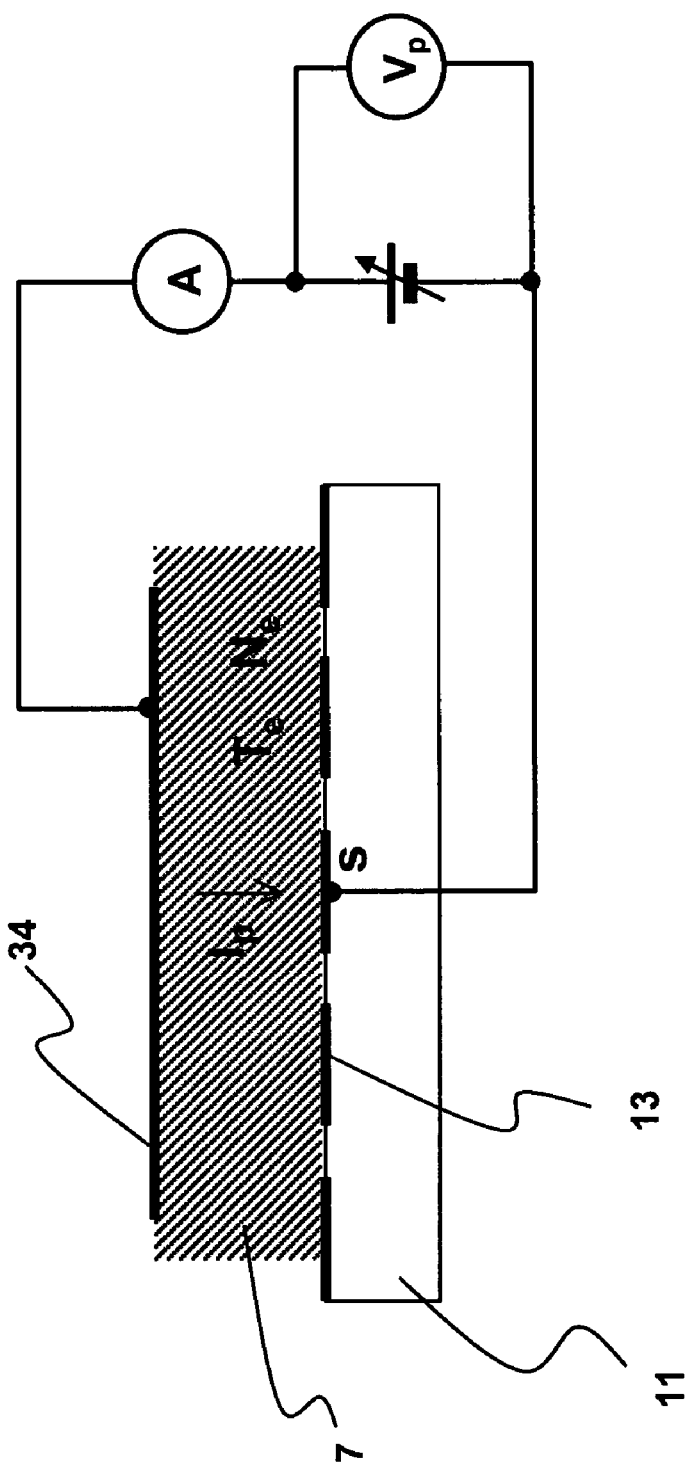
FIG. 4 illustrates the plasma density, electron temperature, ITO surface area, and current Ip flowing in the plasma.
Figure 5:
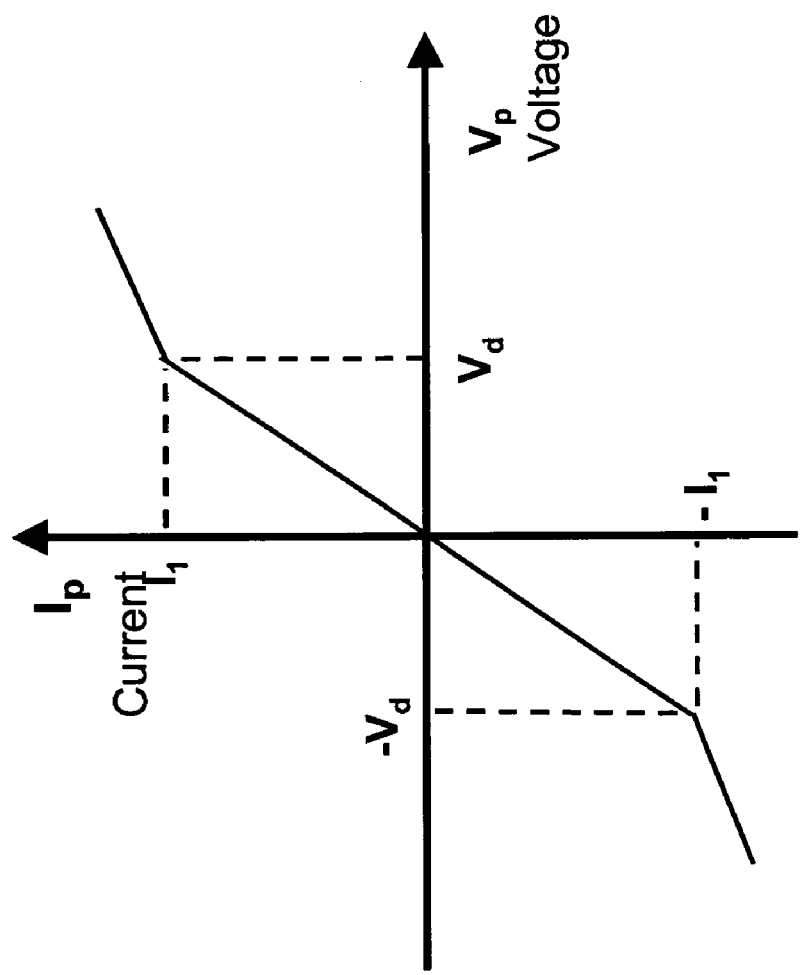
FIG. 5 illustrates the voltage-current characteristics of the current flowing in the plasma.

Next, the characteristics of the plasma used in the present invention are explained by using FIG. 4. In FIG. 4, reference number 34 denotes the current injection electrode using a parallel plate. The surface area of the ITO electrode is set to S; the density of plasma 7 to Ne; and the electron temperature in the plasma 7 to Te. The surface area of the current injection electrode 34 is much larger than the surface area of each ITO electrode 13. The current Ip flowing in the plasma is determined by the current flowing due to the surface area S of one ITO electrode 13. To simplify the calculation, the plasma is completely ionized, which is the state wherein all of the atoms in the plasma 7 are ionized into electrons and positive ions. At this time, the relationship between the current Ip flowing from the current injection electrode 34 through the plasma 7 to the ITO electrode 13 and the voltage Vp applied between the two electrodes is approximated by the three-segment line as in FIG. 5 and have the current-voltage characteristic given by Equation 1.

$$Ip = I1 \tan h(e\,Vd/2kTe) \quad \text{(Eq. 1)}$$

where k is Boltzman's constant; m, the electron mass; and e, the electron charge. The saturation current I1 indicated by the intersection point of the lines is represented by Equation (2).

$$I1 = Nees(kTe/2pm)^{1/2} \quad \text{(Eq. 2)}$$

Now, an example of a typical glow discharge plasma is considered. Let the electron temperature Te be set to 23,200 K (=2.2 eV), and the surface area S of the ITO electrode to $1 \times 10^{-8}$ m² (=100 μm×100 μm). When the maximum current T1 flowing in the TFT is set to 10 μA, the saturation voltage Vp corresponding to the intersection point of the line segments becomes 8 V. The plasma density required to obtain this type of current-voltage characteristic is determined from Equation 2 and becomes $2.6 \times 10^{16}$/m³.

Figure 6:
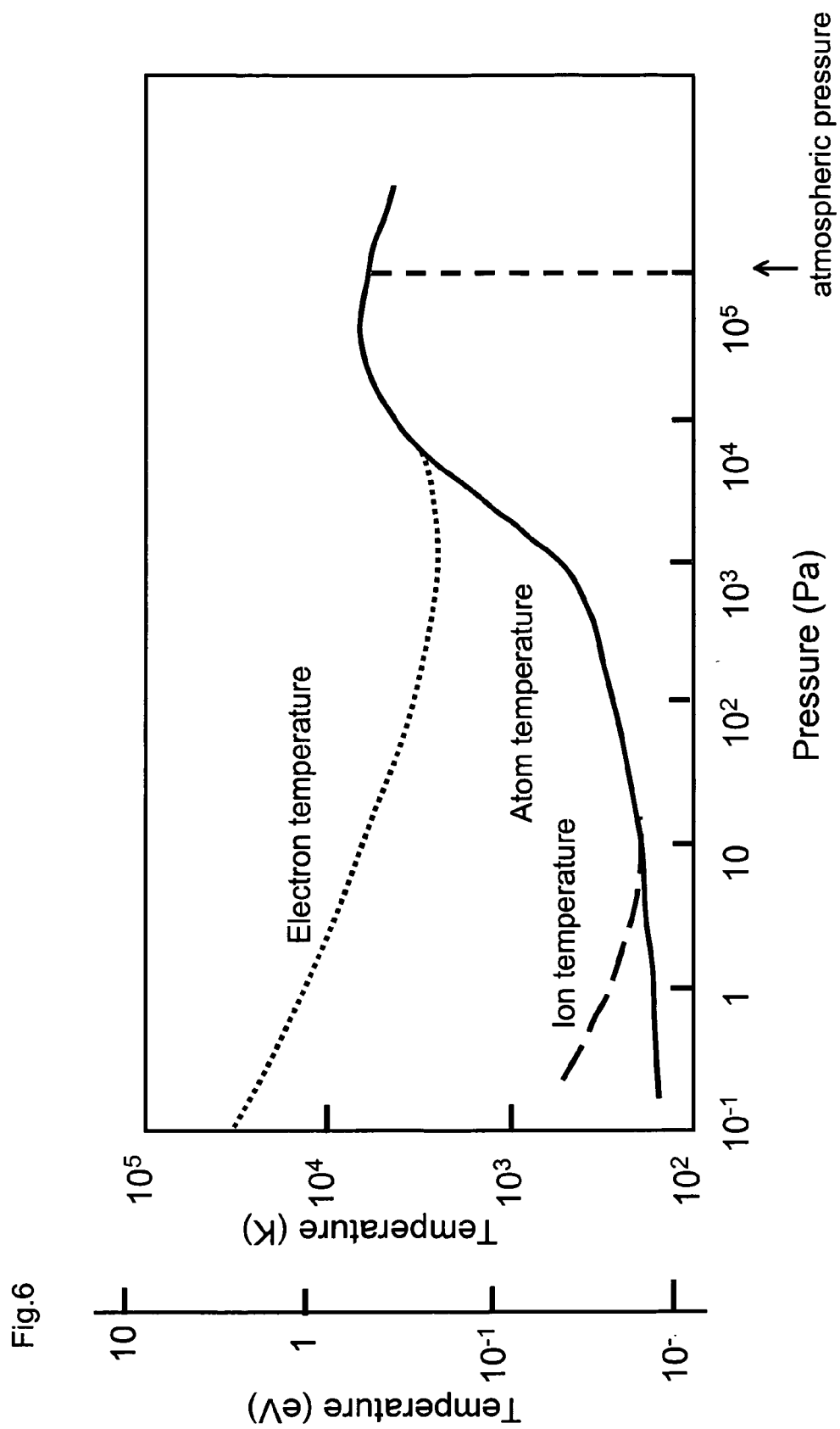
FIG. 6 illustrates the relationship between the pressure and the electron temperature in a typical glow discharge plasma.

Plasma having the plasma density Ne=$2.6 \times 10^{16}$/m³ and the electron temperature Te=23,200 K (=2.2 eV) that are required from the above study becomes necessary. The means for generating this plasma is, for example, an electron cyclotron resonance (ECR) plasma source (maximum Ne: $1 \times 10^{18}$/m³; maximum electron temperature: 15 eV) using cyclotron resonance, or an inductively coupled plasma (ICP) source using inductive coupling (maximum Ne: $1 \times 10^{18}$/m³; maximum electron temperature: 10 eV). From Equations 1 and 2, the relationship between the electron temperature Te and the plasma conductivity s is given as: s proportional to $Te^{3/2}$. Since the relationship between the pressure and the electron temperature Te in a typical glow discharge plasma exhibits a characteristic similar to FIG. 6, generating the plasma at the lowest possible pressure (i.e., about 0.1 Pa) capable of generating plasma is preferred in order to obtain high conductivity.

Table 1 compares the gases for plasma generation required to obtain good conductivity. To obtain high plasma conductivity, usually, the atoms easily ionize at low energy, and gases having a low ionizing electric field are preferred. In addition, alkali metals such as sodium, potassium, and cesium having low ionizing electric fields can be mixed in these gases. Furthermore, in order to have the absolute least damage when the accelerated positive ions collide with an electrode surface such as the ITO, an element having a small mass is preferred. Furthermore, gases having positive ions that do not chemically bond to the ITO surface are preferred. As an example, oxygen that does not chemically bond with oxides such as ITO and has a relatively small ionizing electric field and mass is appropriate.

TABLE 1

|  | Element symbol | Ionizing electric field (eV) | Atomic weight |
|---|---|---|---|
| Inert gas | He | 24.6 | 4.003 |
|  | Ne | 21.6 | 20.18 |
|  | Ar | 15.8 | 39.95 |
|  | Kr | 14 | 83.8 |
|  | Xe | 12.1 | 131.3 |
| Akali metal | Na | 5.1 | 22.99 |
|  | K | 4.3 | 39.1 |
|  | Cs | 3.9 | 132.9 |
|  | H | 13.5 | 1.008 |
|  | N | 14.5 | 14.01 |
|  | O | 13.6 | 16 |

From the first embodiment of the present invention, each TFT and drive circuit can be electrically tested without having physical contact with the surface of the TFT array. Therefore, tests are possible without physically damaging the TFT array and ITO electrodes. In this embodiment, the physical positioning of the probe with each TFT array is not required because the TFT array is in contact with the plasma over a wide area. Therefore, a high-speed testing means can be provided because the testing time per TFT array is determined basically by the speed of electrical switches for the TFT in the plasma. The present invention can detect beforehand product defects that will be caused by defects in the TFT array after the display is assembled, because a means able to realize the characteristics of the drive circuit needed for the current drive in organic EL, in particular, before the organic EL coating process, can be provided. The information needed to repair the defective locations can be easily obtained and the defect rate of the TFT array can be substantially reduced.

Figure 7:
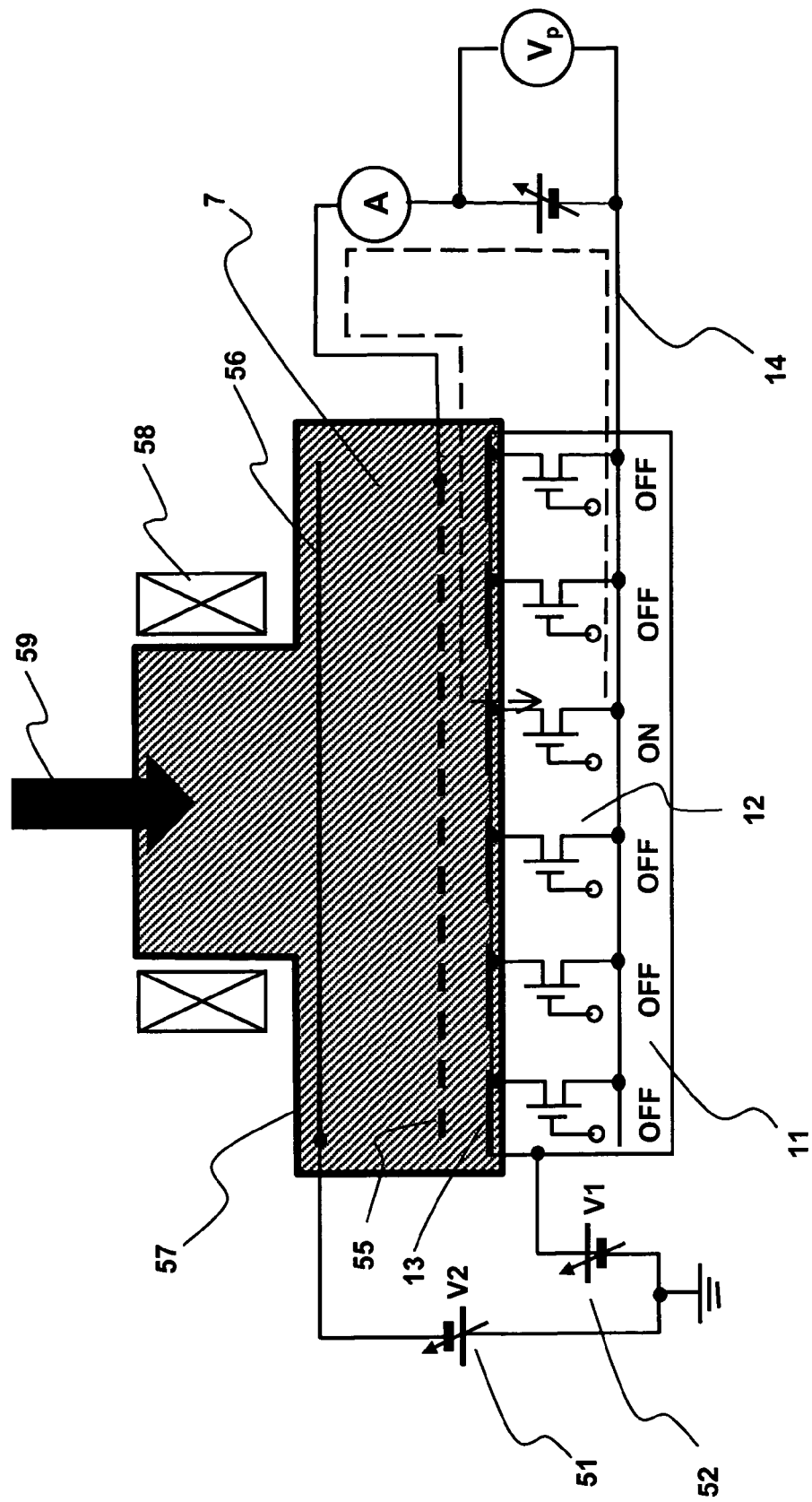
FIG. 7 is a schematic diagram illustrating a second embodiment of the present invention.

FIG. 7 is a schematic drawing illustrating a second embodiment of the present invention. In FIG. 7, reference number 55 denotes a current control electrode; 56, an anode; 57, a probe head; 58, a magnet; 59, gas flow; 51, anode bias; and 52, TFT power supply bias. In the example in FIG. 7, the ECR plasma source using cyclotron resonance is illustrated. The magnet 58 is an electromagnet. A microwave source for plasma excitation is also required, but is omitted from FIG. 7. The type of plasma source is not limited to an ECR plasma source as long as the plasma density and electron temperature shown in the first embodiment of the present invention are satisfied. The plasma 7 generated by the plasma source as long as filled in the probe head 57 and is in contact with the surface of the display substrate 11.

Generally, when the plasma is in contact with the surface of the ITO electrode 13, the state is entered wherein the ITO surface charges to a negative potential, the neutral state of the plasma breaks down near the ITO surface, and the positive ions increase. Usually, the region where the ions increase and the neutral state of the plasma breaks down is referred to as the ion sheath. When an ion sheath containing positive ions is generated, a positive electric field is generated inside the sheath for the ITO surface charged to a negative potential. This electric field accelerates positive ions towards the ITO surface. The current corresponding to the number of accelerated positive ions flows through the plasma 7 to the TFT 12 in the ON state. At this time, when the acceleration electric field due to the ion sheath is excessively large, the current having at least the design tolerance value flows in the TFT 12, and the TFT 12 sometimes breaks down. Setting the appropriate current becomes difficult only in the control of the potential of the power supply Vp.

As shown in FIG. 7, a means for correcting the excess electric field caused by the ion sheath is provided. The anode bias 51 is connected to the anode 56. The TFT power supply bias 52 is connected to the power supply voltage of the TFT array 12. Both bias voltages are set to a condition where the excess current caused by the sheath electric field is reduced, and normal operation is possible without TFT breakdown. After each bias power supply is set to this maximum current condition, the current required in the test is controlled by the current control electrode 55. Appropriate shapes for the current control electrode 55 for this object are a net shape or a lattice shape. In this embodiment, the plasma density and electron temperature needed in the TFT 12 test are similar to the condition shown in the first embodiment. The TFT testing method and the good/poor decision criteria are the same as in the first embodiment.

By using the second embodiment of the present invention, excess current injection into the TFT due to the ion sheath generated on the ITO electrode surface can be prevented. The current can be controlled to an appropriate value without the TFT breaking down because of the excess current.

Figure 8:
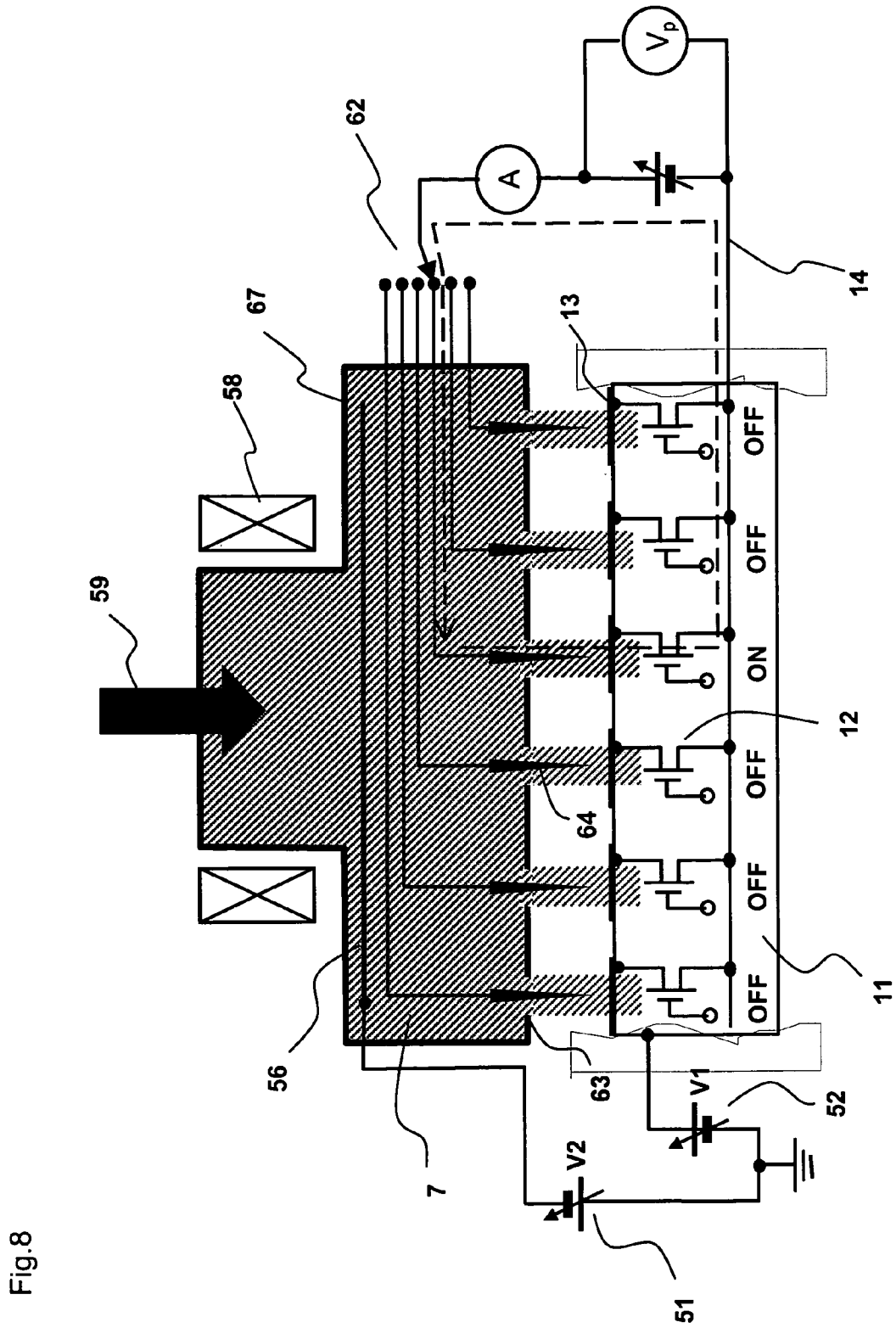
FIG. 8 is a schematic diagram illustrating a third embodiment of the present invention.

FIG. 8 is a schematic drawing similar to FIG. 7 illustrating a third embodiment of the present invention. In FIG. 8, reference number 62 is a signal switcher; 63, a plasma effusion hole; and 64, a current injection electrode. The plasma source in FIG. 8 is equivalent to the second embodiment shown in FIG. 7. The plasma effusion holes 63 are provided on the bottom of the probe head 67. The plasma in the probe head 67 is blown onto the surface of the ITO electrode 13 by the pressure of the gas 59. The center position of the plasma effusion hole 63 matches the center position of each ITO electrode 13 and these holes are arranged in a two-dimensional array similar to the ITO electrodes 13. By doing this, the plasma is concentrated and irradiates only near the surface of the ITO electrode 13. The current injection electrode 64 is positioned at the center of each plasma effusion hole 63. The signal from the current injection electrode 64 is introduced to the signal switcher 62. The current injection electrode 64 can lower the conduction resistance of the air gap that separates the plasma because the electrode is disposed adjacent to the ITO electrode 13. Since the density of the plasma blown out of a plasma effusion hole 63 is low on the periphery of the effusion hole, the conduction resistance between the current injection electrodes 64 can be increased.

The probe head 67 is positioned to place all of the current injection electrodes 64 at the positions corresponding to the center positions of the ITO electrodes 13. The drive line 14 of a TFT in the ON state is connected through the power supply Vp to the signal switcher 62 and simultaneously selects the signal of the current injection electrode 64. The effects and setting conditions of the anode bias 51 and the TFT power supply bias 52 are the same as in the second embodiment. By applying the third embodiment of the present invention, the signal from the current ITO electrode 13 can be selectively detected. Noise such as current leaks from adjacent TFTs is not conducted to the TFT under test via the plasma. Therefore, testing means having high detection accuracy can be provided.

Figure 9:
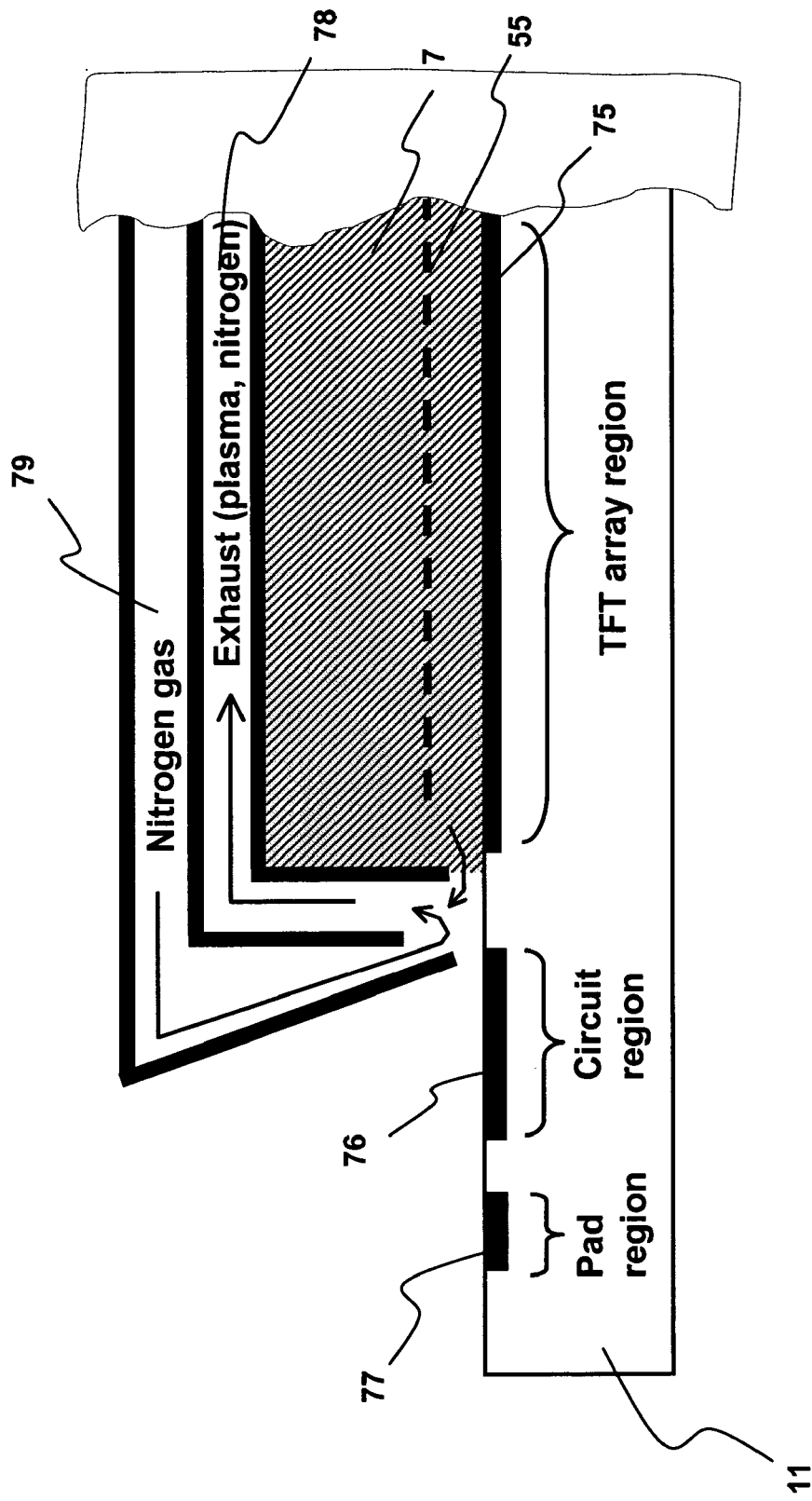
FIG. 9 illustrates the structure enclosing the plasma inside the probe head.

FIG. 9 is a schematic drawing showing a cross-sectional view of the periphery of the probe head 57. In FIG. 9, reference number 75 denotes a TFT array region formed on the display substrate 11; 76, a circuit region; and 77, a pad region. Reference 78 is an exhaust flow path formed in the probe head 17, and 79 is a nitrogen gas flow path. When plasma 7 having conductivity leaks from the periphery of the probe head 57 and comes into contact with the circuit region 76 and the pad region 77, electrical short circuits are produced between the pads and cause poor operation, or become a source of noise. Therefore, a structure wherein the plasma 7 leaks as little as possible to outside of the probe head 17 is required. In FIG. 9, plasma 7 is always exhausted to the outside by the exhaust path 78 so that the plasma 7 does not leak from the gap with the display substrate 11. Simultaneously, nitrogen gas from the nitrogen gas flow path 79 is blown onto the surface of the display substrate 11, and the plasma 7 is enclosed inside of the probe head 57. By doing this, a probe device wherein the plasma does not affect the pad region 77 and circuit region 76 can be provided because the plasma 7 can be maintained at a high density only in the TFT array region 75. The structure of this probe head can be applied to both the first and second embodiments of the present invention.

Figure 10:
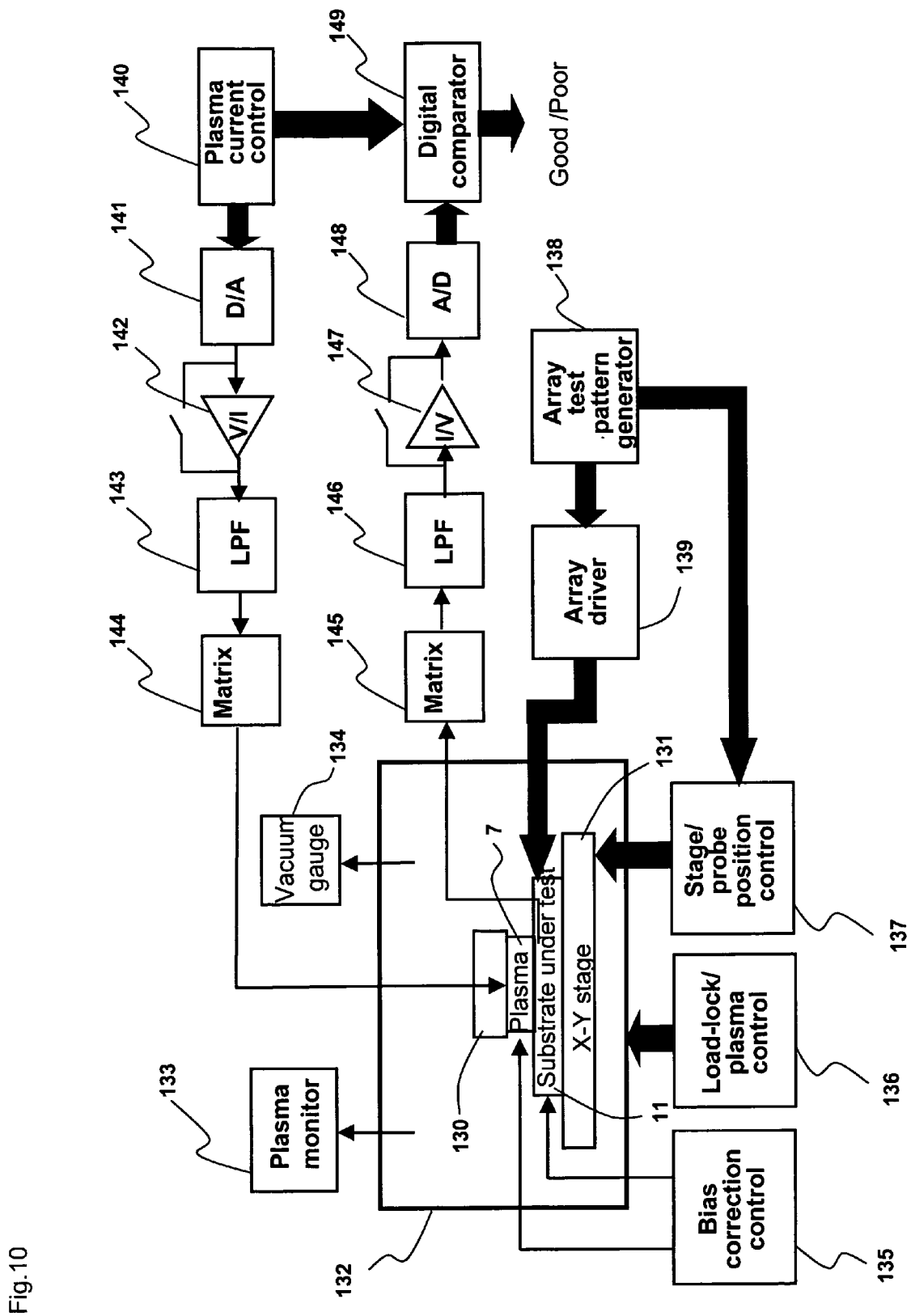
FIG. 10 is a block diagram of the apparatus for testing the electrical characteristics of a TFT array using the probe device of the present invention.
Figure 11:
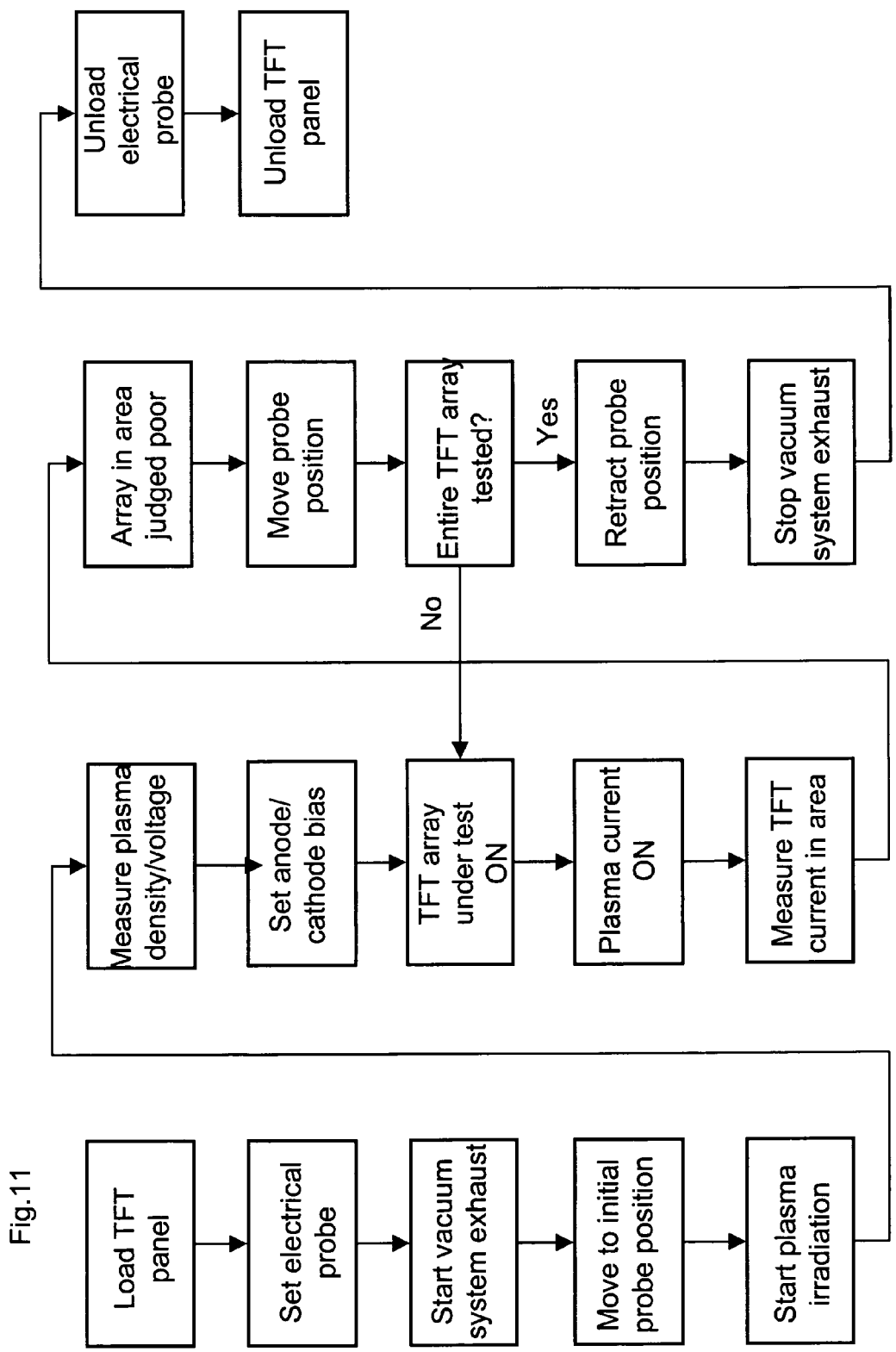
FIG. 11 illustrates the operating procedure of the apparatus for testing the electrical characteristics of the TFT array.

FIG. 10 is a structural diagram of a TFT array testing apparatus that can use the probe device according to the first to the third embodiments of the present invention described above. In FIG. 10, reference number 130 denotes a probe head; 131, an X-Y stage; 132, a vacuum chamber; 133, a plasma monitor; 134, a vacuum gauge; 135, a bias correction controller; 136, a load-lock/plasma controller; 137, a stage/probe position controller; 138, an array test pattern generator; 139, an array driver; 140, a plasma current control; 141, a digital-to-analog (D/A) converter; 142, a voltage-current converter; 143 and 146, lowpass filters; 144 and 145, matrixes; 147, a current-voltage converter; 148, an analog-to-digital (A/D) converter; and 149, a digital comparator. FIG. 11 shows the operating procedure of the testing apparatus shown in FIG. 10.

The display substrate 11 under test is loaded on the X-Y stage 131 and can move in two dimensions in the X and Y directions. By doing this, the plasma 7 generated from the probe head 130 can move to any TFT array region. The motion of the X-Y stage and the vertical control of the probe head 130 are performed by the stage/probe position controller 137. The exhaust flow path 78 and the nitrogen gas flow path 79 are provided so that plasma will not leak out of the probe as illustrated in FIG. 9.

The interior of the apparatus for generating plasma is stored in the interior of the vacuum chamber 132. The density and electron temperature of the plasma generated from the plasma source are monitored by the plasma monitor 133. The vacuum gauge 134 monitors the degree of vacuum in the interior of the vacuum chamber 132. When the display substrate 11 is ejected from or loaded in the vacuum chamber 132, the interior of the vacuum chamber 132 does not need to return temporarily to atmospheric pressure. A separate vacuum chamber (omitted from FIG. 10) is disposed to enable the vacuum to be maintained, and a load-lock is disposed between the vacuum chambers. After the display substrate is introduced into the interior of the vacuum chamber 132 and it is verified that the desired degree of vacuum has been reached by using the vacuum gauge 134, gas is introduced into the interior of the probe head 130, and a high-frequency signal is supplied to generate the plasma. The load-lock/plasma controller 136 performs the necessary sequence of controls.

The array test pattern generator 138 electrically selects a matrix in sequence via the data line and the gate line, and sets the matrix in the ON state. The signal of the array test pattern generator is converted to the logic levels of the external interface of the display substrate 11 under test by the array driver 139. The signal of the array driver 139 is used while in physical contact with the pad region 77 by using, for example, a metal needle. The bias correction controller 135 has the functions of the anode bias 51 and the TFT power supply bias 52 shown in FIGS. 7 and 8 to correct the excess potential difference caused by the ion sheath generated in the plasma.

The plasma current controller 140 controls the test current injected in the plasma. The digital control signals from the plasma current controller 140 are converted to analog voltages by the D/A converter 141 and are converted to current when needed by the voltage-current converter 142. The lowpass filter 143 has the object of removing the high-frequency signals supplied to the plasma source and mixed at the testing apparatus so that noise is not generated in the test signals. The matrix 144 has the object of selectively supplying the test current generated by the plasma current controller 140 to any current injection electrode inside of the probe head 130 and has the functions of the signal switcher 62 in the second embodiment of the present invention.

The current of the TFT set in the ON state by the array test pattern generator 138 is introduced into the current-voltage converter 147 via the matrix 145 and the lowpass filter 146. The object of the lowpass filter 146 is similar to that of lowpass filter 143. After the current that has been converted to a voltage by the current-voltage converter 147 is converted to a digital signal by the A/D converter 148, the current is compared to the input plasma current 140 in the digital comparator 149. If the input current and the current detected through the TFT and the plasma are matched, the TFT under test is judged to have good operation. If there is no match, the TFT is judged to be poor. By performing this sequence of operations automatically for the entire TFT array, the electrical characteristics of the TFT array can be rapidly tested.

Figure 12:
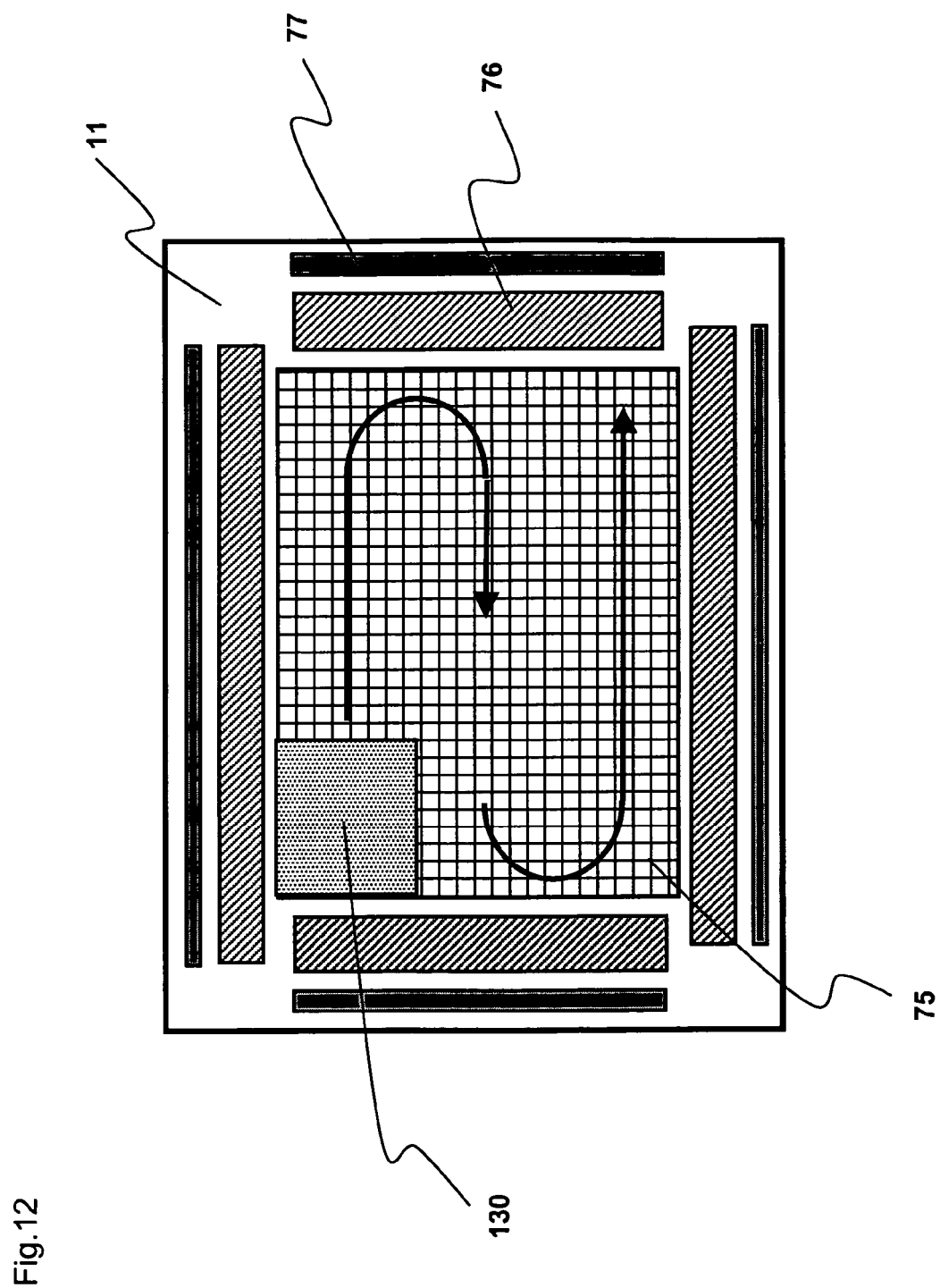
FIG. 12 illustrates the operation of the probe heads above a TFT array panel.
Figure 13:
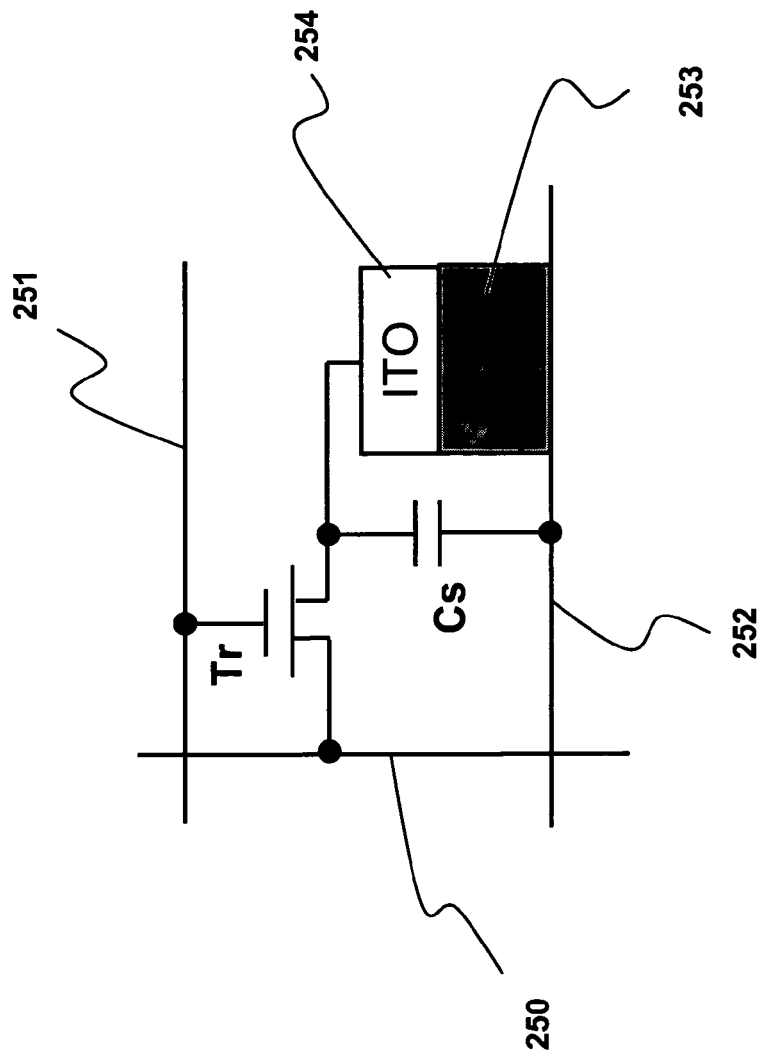
FIG. 13 illustrates the TFT array for driving liquid crystal and the test method therefor of the prior art.

To illustrate the operation of the probe head 130 shown in FIG. 10, a view showing the glass display substrate 11 from above the probe head 130 is shown in FIG. 12. When the display panel under test is large, the position of the probe 130 is sequentially moved relative to the panel, and the tests are performed. Finally, the testing of the entire TFT array ends. Therefore, the shape of the probe head 130 is not limited to the square shape shown in FIG. 12, but is, for example, a structure having a rectangular shape that covers the TFT array region in the vertical direction in the figure and covers the entire TFT array in one motion from the left side to the right side in the figure, and can satisfactorily achieve the object of the present invention. Usually, in the production of display panels, often a plurality of displays are simultaneously formed on a large glass substrate and are cut and separated after assembly. A plurality of the probe head 130 shown in FIG. 10 can be provided to handle the mass production testing of a plurality of display panels. In this case, the testing time can be greatly reduced by simultaneously testing the displays in parallel.

The probe device and the display substrate testing apparatus using the same that were used in the three embodiments of the present invention are suited to testing the electrical characteristics of the TFT array on a glass substrate. In addition, the probe device and the display substrate testing apparatus using the same are not limited to only a TFT array formed on a glass substrate, but can also be applied to testing a TFT array formed on, for example, a resin substrate or a silicon substrate. In addition, it goes without saying that the probe device of the present invention is not limited to the testing application of the display substrate, but can be widely applied to testing the characteristics of other electronic circuits.

The preferred embodiments of the present invention described above are only illustrative examples and do not limit the present invention, which have various modifications and changes for specific applications. For example, in the above preferred embodiments, there is a single source for generating the plasma, but a plurality of generation sources may also be used. In particular, a specified number of plasmas corresponding to each drive circuit can be generated. In this case, the measurements are independently obtained for each drive circuit.

What is claimed is:

1. A probe device for testing a circuit under test and electrodes or wires of a display substrate providing a two-dimensional array of drive circuits on a substrate for a display substrate comprising a circuit under test, which is an electronic circuit comprising a plurality of thin-film transistors, and the electrode or wire connected to said circuit under test, and at least said circuit under test constructs a drive circuit for driving each pixel of the display, wherein relatively high-density plasma is generated between said electrode or wire and a test electrode, a test signal is transmitted between said electrode or wire and said test electrode through said plasma, and said circuit under test can be tested without contact with said electrode or wire, wherein said plasma has a plasma density that can produce a current flowing in said circuit under test of between about 1 μA to 10 μA.

2. The probe device of claim 1, wherein said plasma is continuously generated over a plurality of units of said drive circuit; only the specified drive circuit being tested is set in the on state; and the electrical characteristics of said specified drive circuit are tested by applying said test signal to said specified drive circuit.

3. The probe device of claim 2, wherein two bias power supplies connected independently to said test electrode and said circuit under test are provided; and the electric fields near the interface of said plasma and the test electrode and the interface of said plasma and said electrode or wire can be controlled by one or both of said bias power supplies.

4. The probe device of claim 1, wherein a control electrode is disposed between said test electrode and said electrode or wire, and the excess level of said test signal transmitted through said plasma is controlled by controlling a potential applied to said control electrode.

5. The probe device of claim 1, wherein the electrical characteristics of said drive circuit are tested by separating and generating said plasma on said substrate corresponding to the position of each unit of said drive circuit, said test electrode is disposed at every separated position, and said test signal is applied to said drive circuit at each position.

6. The probe device of claim 1, further comprising a plasma generation source for generating said plasma and a chamber structure for confining said plasma and releasing said plasma to at least said electrode or wire of said drive circuit.

7. The probe device of claim 6, further comprising exhaust for exhausting said plasma or an air curtain is disposed at positions along the outer periphery of said chamber structure.

8. The probe device of claim 1, wherein said plasma is chemically inert relative to said electrode or wire.

9. The probe device of claim 1, wherein said plasma includes a composition that ionizes at least oxygen.

10. A display substrate testing apparatus comprising a circuit under test, which is an electronic circuit comprising a plurality of thin-film transistors, and electrodes or wires connected to said circuit under test comprises:

a probe device for testing a circuit under test and electrodes or wires of a display substrate providing a two-dimensional array of drive circuits on a substrate for a display substrate comprising a circuit under test, which is an electronic circuit comprising a plurality of thin-film transistors, and the electrode or wire connected to said circuit under test, and at least said circuit under test constructs a drive circuit for driving each pixel of the display, wherein relatively high-density plasma is generated between said electrode or wire and a test electrode, a test signal is transmitted between said electrode or wire and said test electrode through said plasma, and said circuit under test can be tested without contact with said electrode or wire;

a signal generation source for generating a test signal provided to said electrode or wire; and a signal comparator for comparing said test signal and the output signal that is output from said drive circuit when said test signal is applied through said plasma and said electrode or wire to each of said drive circuits on said substrate, wherein said plasma has a plasma density that can produce a current flowing in said circuit under test of between about 1 μA to 10 μA.

11. The display substrate testing apparatus of claim 10, wherein a means for X-Y motion for moving the probe device in the horizontal direction in two dimensions along the electronic circuit under test or the display substrate surface is provided.

* * * * *